United States Patent
Fork et al.

(10) Patent No.: US 7,172,707 B2
(45) Date of Patent: Feb. 6, 2007

(54) SPUTTERED SPRING FILMS WITH LOW STRESS ANISOTROPY

(75) Inventors: David K. Fork, Los Altos, CA (US); Scott Solberg, Mountain View, CA (US); Karl A. Littau, Palo Alto, CA (US)

(73) Assignee: Xerox Corporation, Stamford, CT (US)

( * ) Notice: Subject to any disclaimer, the term of this patent is extended or adjusted under 35 U.S.C. 154(b) by 128 days.

(21) Appl. No.: 11/029,618

(22) Filed: Jan. 5, 2005

(65) Prior Publication Data
US 2005/0159002 A1 Jul. 21, 2005

Related U.S. Application Data

(62) Division of application No. 10/121,644, filed on Apr. 12, 2002, now Pat. No. 6,866,255.

(51) Int. Cl.
C23F 1/00 (2006.01)

(52) U.S. Cl. .............................. 216/2; 216/27; 438/745; 257/417

(58) Field of Classification Search .................... 216/2, 216/27; 438/745, 750; 257/417, 418
See application file for complete search history.

(56) References Cited

U.S. PATENT DOCUMENTS

| | | |
|---|---|---|
| 3,842,189 A | 10/1974 | Southgate |
| 3,952,404 A | 4/1976 | Matunami |
| 4,189,342 A | 2/1980 | Kock |
| 4,423,401 A | 12/1983 | Mueller |
| 4,468,014 A | 8/1984 | Strong |
| 4,821,148 A | 4/1989 | Kobayashi et al. |
| 5,280,139 A | 1/1994 | Suppelsa et al. |
| 5,399,232 A | 3/1995 | Albrecht et al. |
| 5,414,298 A | 5/1995 | Grube et al. |
| 5,465,611 A | 11/1995 | Ruf et al. |

(Continued)

FOREIGN PATENT DOCUMENTS

WO    WO 99-18445 A1    4/1999

(Continued)

OTHER PUBLICATIONS

Larson, Lawrence E., RF and Microwave Circuit Design for Wireless Communications, Artech House: Boston 1997, 8 pgs.

(Continued)

*Primary Examiner*—Lan Vinh
(74) *Attorney, Agent, or Firm*—Bever, Hoffman & Harms, LLP; Patrick T. Bever

(57) ABSTRACT

Methods are disclosed for fabricating spring structures that minimize helical twisting by reducing or eliminating stress anisotropy in the thin films from which the springs are formed through manipulation of the fabrication process parameters and/or spring material compositions. In one embodiment, isotropic internal stress is achieved by manipulating the fabrication parameters (i.e., temperature, pressure, and electrical bias) during spring material film formation to generate the tensile or compressive stress at the saturation point of the spring material. Methods are also disclosed for tuning the saturation point through the use of high temperature or the incorporation of softening metals. In other embodiments, isotropic internal stress is generated through randomized deposition (e.g., pressure homogenization) or directed deposition techniques (e.g., biased sputtering, pulse sputtering, or long throw sputtering). Cluster tools are used to separate the deposition of release and spring materials.

32 Claims, 6 Drawing Sheets

U.S. PATENT DOCUMENTS

| | | | |
|---|---|---|---|
| 5,513,518 | A | 5/1996 | Lindsay |
| 5,515,719 | A | 5/1996 | Lindsay |
| 5,534,662 | A | 7/1996 | Peacock et al. |
| 5,536,963 | A * | 7/1996 | Polla .................. 257/417 |
| 5,612,491 | A | 3/1997 | Lindsay |
| 5,613,861 | A | 3/1997 | Smith et al. |
| 5,633,552 | A * | 5/1997 | Lee et al. .................. 310/311 |
| 5,646,449 | A * | 7/1997 | Nakamura et al. .......... 257/761 |
| 5,665,648 | A | 9/1997 | Little |
| 5,780,885 | A | 7/1998 | Diem et al. |
| 5,831,181 | A | 11/1998 | Majumdar et al. |
| 5,848,685 | A | 12/1998 | Smith et al. |
| 5,914,218 | A | 6/1999 | Smith et al. |
| 5,939,623 | A | 8/1999 | Muramatsu et al. |
| 5,944,537 | A | 8/1999 | Smith et al. |
| 5,959,516 | A | 9/1999 | Chang et al. |
| 5,960,147 | A | 9/1999 | Muramatsu et al. |
| 5,979,892 | A | 11/1999 | Smith |
| 6,011,261 | A | 1/2000 | Ikeda et al. |
| 6,117,694 | A | 9/2000 | Smith et al. |
| 6,184,065 | B1 | 2/2001 | Smith et al. |
| 6,184,699 | B1 | 2/2001 | Smith et al. |
| 6,194,774 | B1 | 2/2001 | Cheon |
| 6,213,789 | B1 | 4/2001 | Chua et al. |
| 6,238,533 | B1 | 5/2001 | Satitpunwaycha et al. |
| 6,249,039 | B1 | 6/2001 | Harvey et al. |
| 6,252,175 | B1 | 6/2001 | Khandros |
| 6,264,477 | B1 | 7/2001 | Smith et al. |
| 6,290,510 | B1 | 9/2001 | Fork et al. |
| 6,299,462 | B1 | 10/2001 | Biegelsen |
| 6,352,454 | B1 | 3/2002 | Kim et al. |
| 6,392,524 | B1 | 5/2002 | Biegelsen et al. |
| 6,441,359 | B1 | 8/2002 | Cozier et al. |
| 6,455,885 | B1 | 9/2002 | Lin |
| 6,499,216 | B1 | 12/2002 | Fjelstad |
| 6,505,398 | B2 | 1/2003 | Park |
| 6,528,350 | B2 | 3/2003 | Fork |
| 6,528,785 | B1 | 3/2003 | Nakayama et al. |
| 6,556,648 | B1 | 4/2003 | Bal et al. |
| 6,578,410 | B1 | 6/2003 | Israelachvili |
| 7,037,830 | B1 * | 5/2006 | Rumer et al. ............... 438/656 |
| 2002/0013070 | A1 | 1/2002 | Fork |
| 2002/0040884 | A1 | 4/2002 | Hantschel et al. |
| 2002/0047091 | A1 | 4/2002 | Hantschel et al. |
| 2002/0055282 | A1 | 5/2002 | Eldridge et al. |
| 2002/0079445 | A1 | 6/2002 | Hantschel et al. |
| 2002/0164893 | A1 | 11/2002 | Mathieu et al. |
| 2003/0010615 | A1 | 1/2003 | Fork |

FOREIGN PATENT DOCUMENTS

| | | |
|---|---|---|
| WO | WO 00-33089 A2 | 6/2000 |
| WO | WO 01-48870 A2 | 7/2001 |

OTHER PUBLICATIONS

Rogner, et al, "The LIGA technique—what are the new opportunities," J. Micromech. Microeng. 2 (1992), pp. 133-140.

Nguyen, et al, "Si IC-Compatible Inductors and LC Passive Filters," IEEE Journal of Solid-State Circuits, vol. 25, No. 4, Aug. 1990, pp. 1028-1031.

Kim et al, "Realization of High-Q Inductors . . . " School of Electronics Engineering, Anjoy University, Korea, 4 pgs, no date available.

Scholl, "Power Supplies for Pulsed Plasma Technologies: State-of-the-Art and Outlook," Advanced Energy Industries, Inc. 1999, pp. 1-8.

Zou et al, "Plastic Deformation Magnetic Assembly . . . "IEEE Journal of Microelectromechanical Systems, vol. 10, No. 2, Jun. 2001, 302-309.

Pinnacle Plus+Pulsed DC Power Supply: New Horizons in Reactive Sputtering Performance,: Advanced Energy Industries, Inc. 2 pgs., no date available.

Chen et al, "Nanostructure patterns written in polycarbonate by . . . " J. Vac. Sci. Technol. B19(6), Nov.-Dec. 2001,pp. 2299-2300.

Young, et al, "Monolithic High-Performance Three Dimensional Coil Inductors for Wireless Communication Applications," pp. 3.5.1-3.5.4, no date available.

Datta, Madhav, "Microfabrication by electrochemical metal removal," IBM J. Res. Develop. vol. 42, No. 5, Sep. 1998, pp. 655-669.

Chang, et al, "Large Suspended Inductors on Silicon and Their Use in a 2-um CMOS RF Amplifier," IEEE Electron Device Letters, vol. 14, No. 5, May 1993, pp. 246-248.

Zhang, et al, A MEMS nanoplatter with high-density parallel kip-pen nanolithography probe arrays, IOP Publishing, Nanotechnology 13 (2002) pp. 212-217.

Young, et al., "A Low Noise RF Voltage-Controlled . . . Micromachined Variable Capacitor," pp. 128-131, no date available.

Craninckx, et al, "A CMOS 1.8GHz Low-Phase Noise-Voltage-Controlled-Oscillator with Prescaler," 1995 IEEE International Solid-State Circuits Conference, Digest of Rechnical Papers, pp. 266-268.

Nguyen et al. "A 1.8 GHz Monolithic LC Voltage-Controlled Oscillator," IEEE Journal of Solid-State Circuits, vol. 27, No. 3, Mar. 1992, pp. 444-450.

* cited by examiner

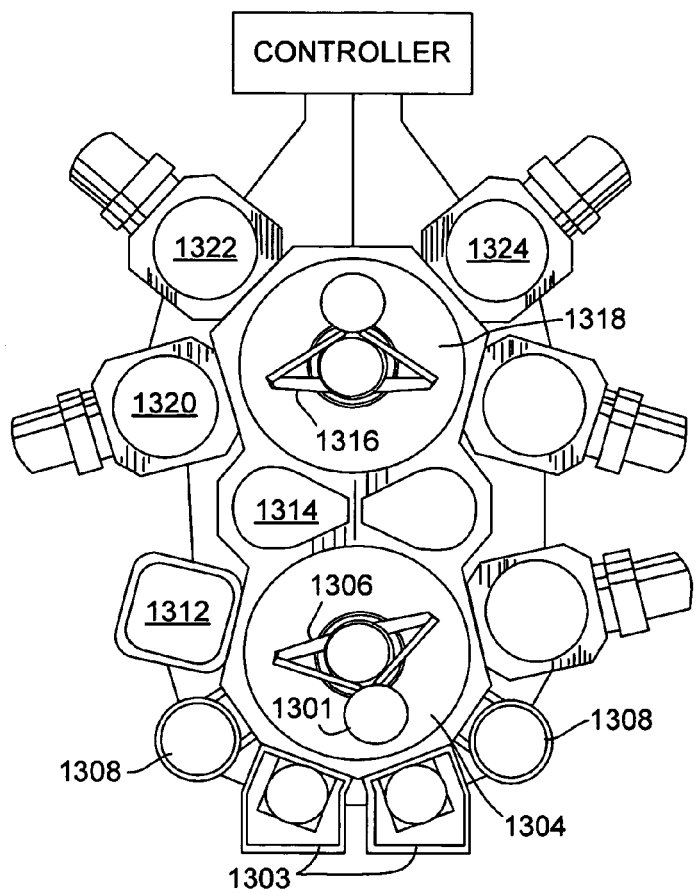
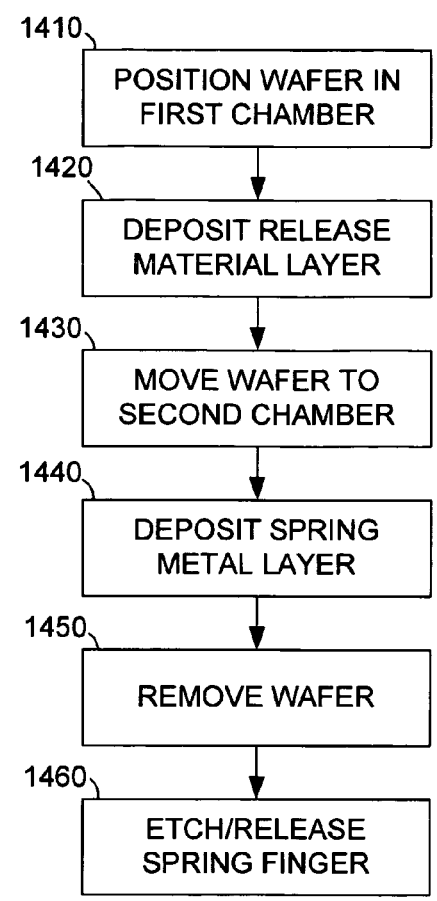
FIG. 13
FIG. 14

SPUTTERED SPRING FILMS WITH LOW STRESS ANISOTROPY

RELATED APPLICATIONS

This application is a divisional of U.S. patent application Ser. No. 10/121,644 entitled: "Sputtered Spring Films With Low Stress Anisotrophy" filed Apr. 12, 2002 now U.S. Pat. No. 6,866,255.

FIELD OF THE INVENTION

This invention relates generally to methods of fabricating photolithographically patterned spring structures, and, more particularly, to methods of controlling the stress anisotropy during the deposition of spring films, and to the spring structures formed by these methods.

BACKGROUND OF THE INVENTION

U.S. Pat. No. 5,914,218 (Smith et al.) describes photolithographically patterned spring structures for use in the production of low cost probe cards, to provide electrical connections between integrated circuits, or to form coils that replace surface-mount inductors. A typical spring structure includes a spring finger having an anchor portion secured to a substrate, and a free portion initially formed on a pad of release material. The spring finger is etched from a thin spring material layer (film) that is fabricated such that its lower portions have a higher internal compressive stress than its upper portions, thereby producing an internal stress gradient that causes the spring finger to bend away from the substrate when the release material is etched. The internal stress gradient is produced in the thin spring material film either by layering different materials having the desired stress characteristics, or using a single material by altering the fabrication parameters.

A problem with high-volume production of integrated circuits incorporating photolithographically patterned spring structures is that the released "free" portions of some spring structures fabricated according to conventional methods undergo helical twisting, thereby skewing (displacing) the spring structure tips from their intended position. A spring structure is typically designed to curl or bend perpendicular to the underlying substrate (i.e., in a plane passing through the spring structure's longitudinal axis) upon release such that the tip is located in a predefined position above the substrate. The tip's position is typically matched to a receiving structure (e.g., a contact pad) formed on an integrated circuit to which the spring structure is electrically connected. Helical twisting causes the spring structure to bend such that the tip is positioned away from the predefined position, thereby preventing optimal connection between the spring structure and the receiving structure. To make matters worse, the amount of skew tends to vary according to orientation of the spring structure, and spatially over the wafer upon which the spring structures are produced in high volume. That is, in one region of a wafer, spring structures oriented in a particular direction may experience a relatively small amount of twisting, while spring structures in that region oriented in another direction experience pronounced twisting. Also, similarly oriented spring structures that are located in different regions may experience different amounts of twisting. The amount of skew can even be zero in certain locations and orientations.

The amount of skew that can be tolerated in a spring structure depends critically on the application in which the spring structure is used. For the manufacture of self-assembling out-of-plane inductors, for example, the specification for the skew is the lesser of ±1% of the spring diameter or ±5 microns. For other applications, such as packaging, the specification may be a little less stringent, and will depend on the size and spacing of the pads that the springs are designed to contact.

As suggested above, one solution to problems facing high-volume production of integrated circuits incorporating photolithographically patterned spring structures is to design systems that take into account the expected range of spring structure skew (which would be determined experimentally before high-volume production is initiated). However, this solution generates inefficiencies (e.g., wider spring structure spacing and larger contact pads) that increase production costs. Another possible solution would be to identify the locations and orientations on the wafers at which zero skew occurs in a given fabrication process, and then only fabricate spring structures in these zero skew locations. However, this solution would limit the wafer area utilized to fabricate spring structures, thereby making high-volume production expensive and complicated.

What is needed is a method for fabricating spring structures that minimizes or eliminates helical twisting, thereby facilitating high-volume production.

SUMMARY OF THE INVENTION

The present invention is directed to methods for fabricating spring structures that minimize helical twisting by reducing or eliminating stress anisotropy before release, which is characteristic of conventional spring material films, through manipulation of the fabrication process parameters and/or spring material compositions. By reducing or eliminating stress anisotropy in the spring material film (i.e., before release), spring structures can be formed at any location and in any orientation on a substrate without significant helical twisting. Accordingly, the complicated and expensive design requirements of conventional spring structures are eliminated, thereby greatly simplifying high-volume production and minimizing production costs. The present invention is also directed to the spring structures fabricated using these methods.

In accordance with the present invention, spring structures are fabricated such that the spring film includes at least one layer in which the internal stress is isotropic (i.e., the internal stress essentially equal in all directions). The present inventors have determined that skew is primarily caused by stress anisotropy in the thin film from which the spring structure is formed (i.e., different stress magnitudes existing along different orthogonal directions within the spring material film). By causing the stress in this one or more layer to be isotropic, total anisotropy in the spring material film is reduced (i.e., provided the remaining layers have the same or less anisotropy as that typically produced in conventional spring material films). The resulting reduction in stress anisotropy reduces skew (helical twisting) by equalizing stress components along the principal stress axes. The one or more isotropic stress layers may include an isotropic compressive layer, an isotropic tensile layer, an isotropic neutral (zero stress) layer, or any combination thereof. When both isotropic compressive and isotropic tensile layers are formed, a capping film (e.g., Nickel or Gold) or an intermediate, non-isotropic layer may be utilized to minimize delamination.

In accordance with an embodiment of the present invention, isotropic internal stress is generated in one or more layers of a spring material before release by saturating the internal stress of the one or more layers of the spring material film. Stress saturation causes the one or more layers to become essentially isotropic (uniform) because further applied stress pushes the spring material beyond its yield point, producing relaxation of the material that relieves the additional stress and causes the internal stress to remain at the saturated level. By forming at least one layer of the spring material film in this manner, the resulting spring structure exhibits less stress anisotropy than that produced using conventional methods, thereby reducing the magnitude of helical twisting. Stress saturation of the spring material films is achieved through various methods disclosed herein. In accordance with one disclosed method, stress saturation is achieved by manipulating the fabrication parameters (i.e., temperature, pressure, and electrical bias) formation of the spring material film to generate the saturated tensile or compressive stress. Methods are also disclosed for tuning the saturation point of the spring material by varying the deposition temperature, annealing after growth, formation on silicon and then cooling, and by adjusting the spring material composition to beneficially modify its saturation characteristics. In one embodiment, the spring material films are balanced (i.e., equal amounts of compressive and tensile stress), which produces the thickest springs for a given design radius. In an alternative embodiment, the spring material films are unbalanced (e.g., with a saturated compressive layer that is thicker or thinner than the saturated tensile layer), which produces thinner springs for a given design radius.

In accordance with other disclosed embodiments of the present invention, isotropic internal stress is generated in one or more layers of a spring material before release through randomized or directed deposition techniques. In one embodiment, the compressive anisotropy is reduced through randomized deposition caused by gas scattering homogenization. In other disclosed embodiments, anisotropy is reduced through directed deposition using biased sputtering, pulse sputtering, or long throw sputtering techniques. By controlling the direction in which the spring material is deposited using these deposition techniques, stress anisotropy is reduced or eliminated, thereby increasing spring structure yields and facilitating high-volume production and minimizing production costs.

BRIEF DESCRIPTION OF THE DRAWINGS

These and other features, aspects and advantages of the present invention will become better understood with regard to the following description, appended claims, and accompanying drawings, where:

FIG. 13 is a simplified top view showing a cluster tool utilized to produce spring structures in accordance with yet another embodiment of the present invention; and FIG. 14 is a flow diagram showing a process for producing spring structures using the cluster tool of FIG. 13.

DETAILED DESCRIPTION OF THE DRAWINGS

The present inventors have determined that the cause of helical twisting during high-volume production of spring structures is anisotropic stress in the spring material film. Stress anisotropy is the inequality of magnitudes of the biaxial stress along the two orthogonal principal stress axes. The present inventors have also determined that stress anisotropy can occur at any point on a wafer, it can vary spatially over the wafer, and it can even be zero at certain locations, thereby producing the variety of helical twisting observed in high-volume spring structure production. In particular, helical twisting occurs when the longitudinal axis of a released spring structure is not aligned with one of the principal stress axes. When an isotropic stress is present, the stresses along the principal stress axes differs, thereby causing the released spring finger to twist, skewing the tip from a point that is aligned with the longitudinal axis of the spring structure.

Figure 1A:
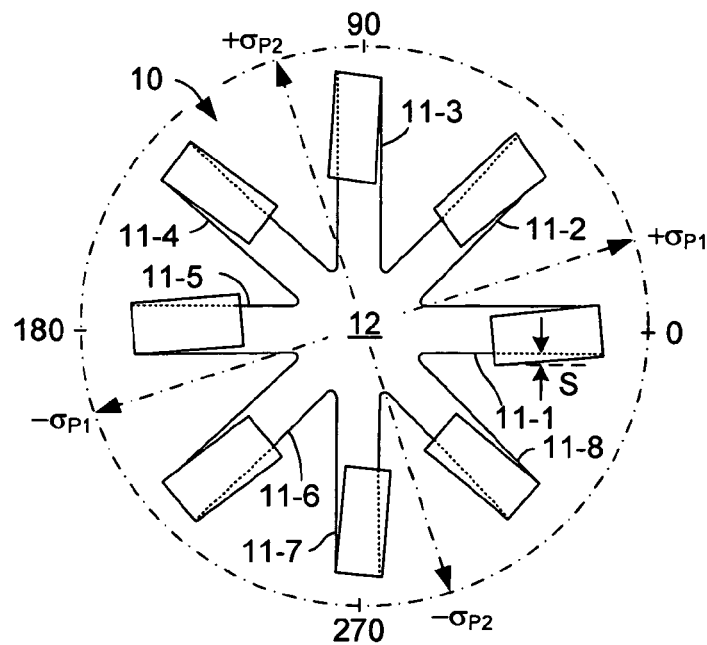
FIGS. 1(A) and 1(B) are top and partial front views, respectively, of a spring material stress gauge illustrating helical twisting caused by anisotropic stress variations in a conventional spring material film.
Figure 1B:
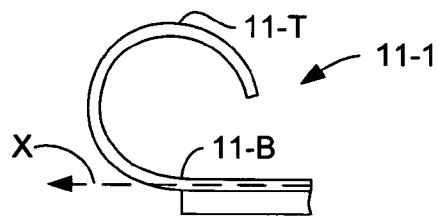

FIGS. 1(A) and 1(B) are top and partial front views, respectively, of a spring material stress gauge (test structure) 10 utilized by the present inventors to illustrate helical twisting caused by anisotropic stress variations in a spring material film. Stress gauge 10 includes several springs 11-1 through 11-8 that extend in many directions from a central region 12. Angular positions (in degrees) are indicated around stress gauge 10 for convenience. According to the selected origin, a base portion of spring 11-1 is aligned generally along the 0 degree position.

Stress gauge 10 is etched from a conventional spring material film that is fabricated as described above. Accordingly, stress gauge 10 is subjected to biaxial stress whose principal components are aligned along two orthogonal directions (designated $\sigma_{P1}$ and $\sigma_{P2}$). The effects of stress anisotropy are quantified by measuring the skew S of a released spring, such as spring 11-1 of stress gauge 10. The skew S is defined as the displacement of the top-most part 11-T of spring 11-1 (see FIG. 1(B)) relative to the unreleased material at the base 11-B of spring 11-1. The skew S is the result of helical bending in spring 11-1, which occurs when (1) the two principal components of the biaxial stresses in the spring material film from which spring 11-1 is formed are unequal, and (2) the axis X of spring 10-1 is not aligned to either principal component.

Figure 2:
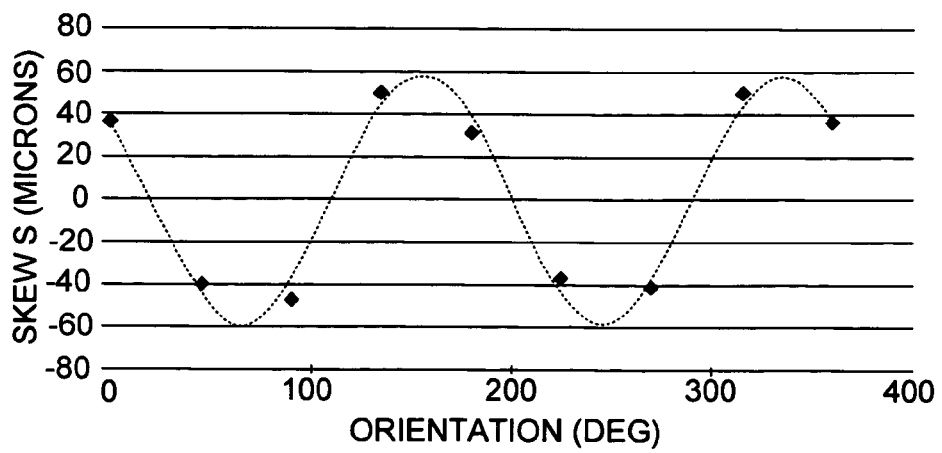
FIG. 2 is graph showing skew variations relative to biaxial stress components measured using the stress gauge shown in FIGS. 1(A) and 1(B)

FIG. 2 is a table that charts skews measured in the springs of stress gauge 10 (FIG. 1). As FIG. 2 illustrates, by making stress gauge 10 with springs pointing in many directions, the magnitude and the direction of the skew varies in relation to the principal components of biaxial stress. In FIG. 2, the skew is defined as positive when the helical bending is right handed. As FIG. 2 indicates, for non-zero anisotropy, depending on their orientation, springs can assume either right or left handed helical bending, and at four specific orientations aligned with the principal stress components, the skew is predicted to be zero. In the case illustrated in FIG. 2, the zero skew angles are approximately 20, 110, 200 and 290 degrees relative to the selected origin. However, as mentioned above, the amount and direction of skew vary widely over a wafer, so spring structures formed at different wafer locations are subjected to a wide variety (i.e., both direction and degree) of helical twisting. This wide skew variation makes high-volume production complicated because, in order to avoid helical twisting, each spring structure must be designed to align with the principal stress axes at the wafer location where that spring structure is fabricated. To further complicate this issue, there is evidence that the principal stress component directions may vary from one layer to another within the spring material film. At a minimum, these design considerations greatly increase fabrication costs, and can render high-volume production impractical.

Figure 3:
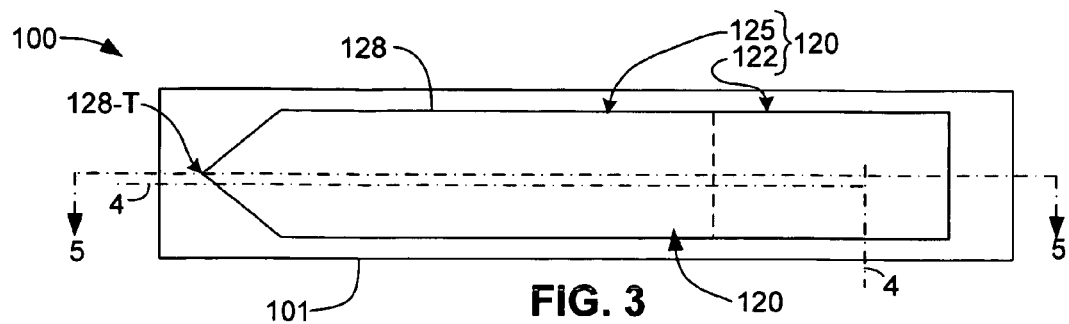
FIG. 3 is a top view showing a spring structure according to the present invention.
Figure 4:
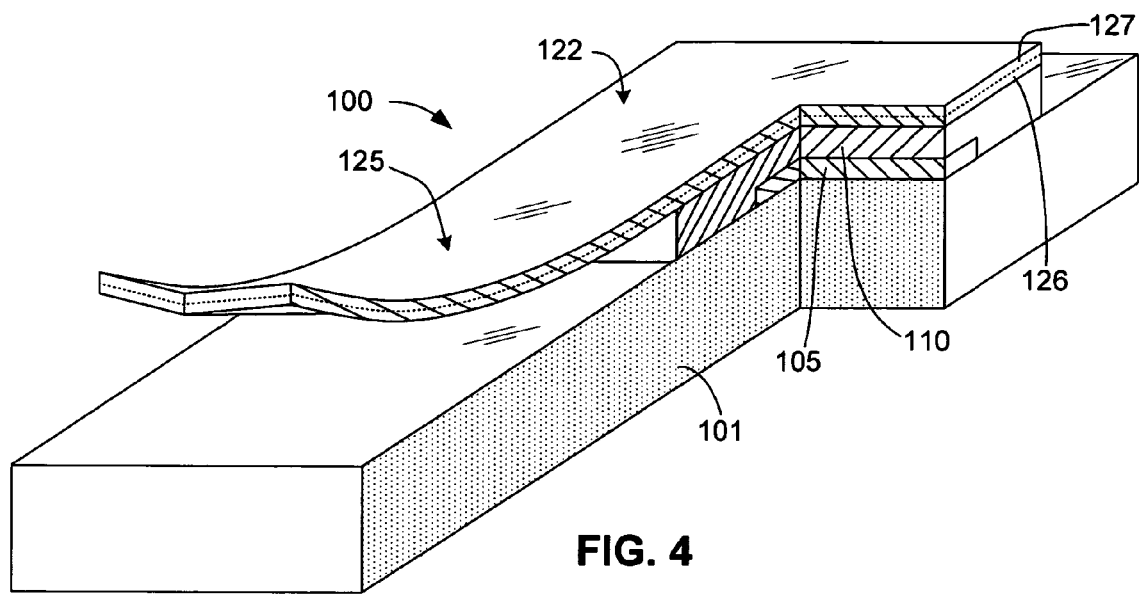
FIG. 4 is a cutaway perspective view taken along line 4—4 of the spring structure shown in FIG. 3.

FIG. 3 is a plan view showing a spring structure 100 according to an embodiment of the present invention. FIG. 4 is a perspective view showing a portion of spring structure 100, and includes a cut-away section indicated by section line 4—4 in FIG. 3. Spring structure 100 is formed on a substrate 101, and includes a release material portion 110 and a spring finger 120. Substrate 101 (e.g., glass) includes an optional conductor 105 that can take several forms. Release material portion 110 is formed above substrate 101 such that it contacts conductor 105 (if present). In one embodiment, release material portion 110 may be formed using a metal selected from the group consisting of Titanium, Copper, Aluminum, Nickel, Zirconium, and Cobalt, or formed using heavily doped silicon, to facilitate electrical conduction between conductor 105 and spring finger 120. Spring finger 120 includes an anchor portion 122 and a free (i.e., cantilevered) portion 125. Anchor portion 122 is attached to release material portion 110 (i.e., such that release material portion 110 is located between anchor portion 122 and substrate 101). Free portion 125 extends from anchor portion 122 over substrate 101.

Similar to prior art spring structures, spring finger 120 is etched from a thin stress-engineered film that is deposited by DC magnetron sputtering or chemical vapor deposition (CVD) techniques, or deposited by plating techniques. In one embodiment, the stress-engineered film includes or one or more materials suitable for forming a spring structure (e.g., one or more of molybdenum (Mo), a "moly-chrome" alloy (MoCr), tungsten (W), a titanium-tungsten alloy (Ti:W), chromium (Cr), nickel (Ni), silicon (Si), nitride, oxide, carbide, or diamond. The deposition process is performed using gas pressure variations in the deposition environment during film growth in accordance with known techniques (e.g., by varying Argon gas pressure while sputtering the spring material). Typically, this stress-engineered film includes at least one layer that has a relatively compressive (or less tensile) internal stress, and at least one layer that has a relatively tensile (or less compressive) internal stress, these different stress layers providing the upward bending bias when the underlying release material is removed, resulting in a curved, cantilever spring structure. The term "layer" is used herein to describe a cross-sectional region of the stress-engineered film that is formed during a given time period. For example, FIG. 5 shows a dashed line generally delineating a first (lower) layer 126 that is formed during a first period of the sputtering process, and a second (upper) layer 127 that is formed over (or on) first layer 126 during a subsequent period of the sputtering process.

In accordance with the present invention, spring structure 100 is fabricated in a manner that produces at least one layer (i.e., first layer 126 and/or second layer 127) of spring finger 120 having isotropic internal stress before being released from substrate 101. As utilized herein, the term "isotropic internal stress" means that the magnitude of internal stress measured along both principal stress axes of the stress-engineered film, whether compressive or tensile, is essentially the same (i.e., within 1% or less). By definition, forming one or more layers of spring finger 120 with isotropic stress produces an overall stress profile that is less anisotropic than in conventional spring structures. As pointed out above, anisotropic stress distributions are a major cause of helical twisting and spring tip skew. By forming at least one of the compressive layer or the tensile layer with isotropic internal stress, the total stress exerted on spring finger 120 upon release is typically less than in spring structures having anisotropic stresses (i.e., formed using conventional methods), thereby reducing or eliminating helical twisting. Further, the reduction of helical twisting by incorporating one or more isotropic stress layers facilitates high-volume production when the isotropic layer is extended over the entire wafer. Note that the relaxation of internal stress occurring in free portion 125 of spring structure 120 after release eliminates the pre-release stress isotropy. However, anchor portion 122, which is not released, retains the one or more layers having isotropic internal stress.

In accordance with an aspect of the present invention, the one or more isotropic stress layers may include an isotropic compressive layer, an isotropic tensile layer, or both isotropic compressive and tensile layers. For example, referring to FIG. 4, in accordance with one alternative embodiment, first layer 126 of spring structure 100 has an isotropic compressive internal stress, and non-isotropic tensile second layer 127 is formed on first layer 126. In another alternative embodiment, first layer 126 of spring structure 100 is formed with non-isotropic compressive stress, and an isotropic tensile second layer 127 is formed thereon. In yet another alternative, both the compressive internal stress of first layer 126 and the tensile internal stress of second layer 127 are isotropic. Of course, anisotropy is minimized when spring finger 120 is entirely formed from isotropic material. However, as mentioned above, some applications that require less stringent design specifications, may be suitably produced from spring fingers that are only partially isotropic.

In accordance with another aspect, when a spring structure includes both an isotropic compressive layer and an isotropic tensile layer, one or more optional structures may be utilized to prevent delamination of the spring finger. Referring to FIG. 4, spring fingers 120 including bi-level stress (i.e., only compressive layer 126 and tensile layer 127) can have a larger moment than spring fingers that have more than two stress layers. Therefore, for a given design radius, bi-level spring finger 120 may be more likely to delaminate (i.e., separate from release material portion 110 or substrate 101).

Figure 5A:
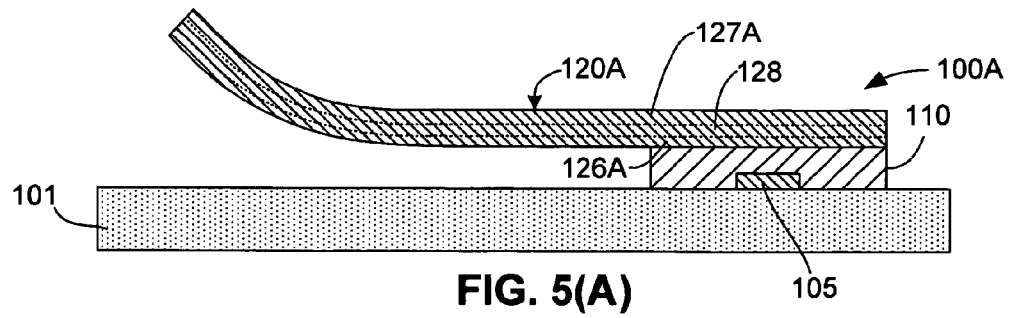
FIGS. 5(A) and 5(B) are front section views taken along line 5—5 of FIG. 3, and show alternative embodiments of spring structures formed in accordance with the present invention.
Figure 5B:
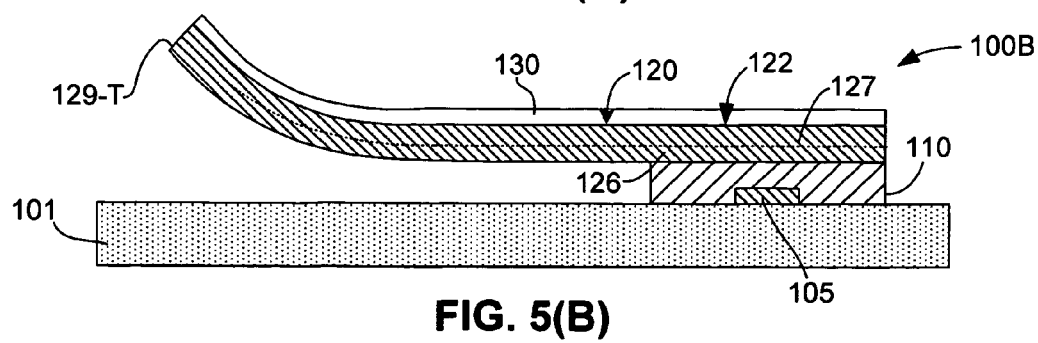

FIGS. 5(A) and 5(B) are cross-sectional side views showing spring structures 100A and 100B according to alternative embodiments of the present invention, and are taken along section line 5—5 of FIG. 3. For convenience, elements of alternative spring structures 100A and 100B that are similar to those of spring structure 100 (discussed above) are identified with the same reference numbers.

Referring to FIG. 5(A), spring structure 100A includes a spring finger 120A that is formed with an intermediate layer 128 sandwiched between a lower isotropic compressive layer 126A and an upper isotropic tensile layer 127A. Intermediate layer 128 is formed with an internal stress that is between the isotropic compressive internal stress of layer 126 and the tensile internal stress of layer 127 to reduce the stress gradient between compressive layer 126A and tensile layer 127A. In alternative embodiments, intermediate layer 128 may include two or more internal stress magnitudes, or may be represent a region whose internal stress gradually changes from compressive to tensile. Note that the intermediate stress of layer 128 may not be isotropic, but, when designed properly for a given application, isotropic layers 126 and 128 can be fabricated to substantially overcome any twisting forces exerted by anisotropy of intermediate layer 128.

Referring to FIG. 5(B), spring structure 100B includes a spring finger 120 that is similar to that described above (i.e., isotropic tensile stress layer 127 formed directly on isotropic compressive layer 126). In addition, to prevent delamination, spring structure 100B includes a coating 130 (e.g., a plated metal such as Gold or Nickel) that is formed on anchor portion 122 of spring finger 120 either before or after free portion 125 is released (i.e., after release material located under free portion 125 is removed). When coating layer 130 is a plated metal formed after free portion 125 is released, coating 130 may be deposited on the exposed surface of both upper layer 127 and lower layer 126 of free portion 125, thereby providing structural and electrical characteristics that are superior to spring structures that are formed without plated metal, or having plated metal formed only on one side. A plated metal coating 130 (FIG. 5(B)) provides several other potentially important benefits to spring structure 100B. For example, plated metal may be used to electroform the closure of mechanically contacted elements (e.g., an out-of-plane inductor formed using a series of spring fingers bent such that the free end of each spring finger contacts the anchor portion of an adjacent spring finger). Plated metal may also be used to passivate spring finger 120, which is important because most springy metals, such as stress-engineered metal film 220, form surface oxides. Plated metal may also be added to increase wear resistance and lubricity. Plated metal can also provide a compression stop to limit spring compression. Moreover, plated metal may be added to strengthen spring structure 100 by adding ductility. Finally, plated metal may be added to blunt the radii of process features and defects that can arise on spring finger 120. Note that adding plated metal (coating) 130 over free portion 125 will increase the spring constant of spring finger 120 by stiffening free portion 125. The above-mentioned benefits are not intended to be exhaustive.

Note that optional conductor 105 is included to provide electrical coupling of spring structure 100 to an external electrical system (not shown). Note also that the electrical coupling between spring finger 120 and conductor 105 necessitates using an electrically conductive release material to form release material portion 110. However, electrical coupling can also be provided directly to spring finger 120 by other structures (e.g., wire bonding), thereby allowing the use of non-conducting release materials.

Several methods will now be described for generating the isotropic spring material films utilized in accordance with the present invention.

In accordance with an embodiment of the present invention, a spring structure includes at least one layer having an internal stress that is either at the compressive saturation point or the tensile saturation point of the spring material from which the spring structure is made. The term "saturation point" in this context means a maximum value that the internal stress of the spring material (i.e., the spring material film) cannot exceed. Stress saturation causes the spring material to become essentially isotropic (uniform) because further applied stress pushes the spring material beyond its yield point, producing relaxation of the material that relieves the additional stress and causes the internal stress to remain at the saturated level. In particular, if the material is stressed (i.e., pushed) beyond its yield point, then the material is going to flow or otherwise rearrange its internal structure to relieve the excess stress, returning the material to the so-called yield point of the material. In other words, no matter how the stress is put in, if a compressive stress greater than the compressive saturation point is put into the spring material, then the spring material is going to relax back to the level of stress that is within the strength limit of the material that is grown (i.e., to the compressive saturation point). Similarly, if a tensile stress greater than the tensile saturation point is put into the spring material, then the spring material is going to relax back to the tensile saturation point. Therefore, by saturating the stress, the material is subjected to all the stress that the material can bear, and beyond the saturation point the internal structure no longer responds structurally to store the excess stress, and it undergoes plastic flow to accommodate additional strain imposed upon it.

The present inventors have observed that the compressive stress anisotropy in a spring material film tends to become smaller when the spring material has an internal stress that is at the compressive or tensile saturation point of the spring material. In particular, the present inventors formed spring gauges (similar to those described above) on several wafers utilizing the methods described below that produced saturated internal stress in at least one layer, and then measured the stress along X- and Y-axes on each wafer. The differences in stress levels were also measured at different pallet locations (each pallet of the test equipment held more than one wafer; note that other deposition tools may hold only one wafer, but the wafers referred to were not processed on a cluster tool). What the inventors observed was that anisotropy over the entire wafer (and pallet) was substantially reduced when the spring material film included a saturated compressive stress layer.

By forming at least one layer of the spring material film at the saturation point, the resulting spring structure exhibits less stress anisotropy than that produced using conventional fabrication methods, thereby reducing the magnitude of helical twisting. That is, conventional techniques do not saturate the stress beyond the yield point of the material, so that the spring material film captures different stresses in different orthogonal directions; and, because the spring material film is below the yield point, these different stresses are captured or frozen into the molecular structure of the film, thereby creating anisotropy. In contrast, because the spring material films of the present embodiment are formed using much larger stresses that are close to the yield point of the spring material, then when stress is applied in one direction that tends to produce a larger stress in that direction than in another direction, the material "refuses" to store the additional stress and relaxes in the applied direction to the yield point of the material. The anisotropy reduction makes sense from the standpoint of there being no margin left for anisotropy if the material is at its yield point. Note that the bulk yield point and the yield point of the growing film are not necessarily the same because the bulk and surface relaxation mechanisms can differ.

Ideally, anisotropy is minimized by fabricating a spring structure having a stress profile with only two levels, one formed by a compressive stress layer, and one formed by a tensile stress layer, both of which being grown at or near the stress saturation points of the spring material. For example, referring again to FIG. 4, in such an ideal embodiment, lower layer 126 is formed with internal stress at the compressive saturated stress level, and upper layer 127 is deposited directly on lower layer 126 and formed with internal stress at the tensile saturated stress level. By forming both layers 126 and 127 at these saturation points and omitting any non-saturated layers, an ideal spring structure is formed in which anisotropy is effectively eliminated. However, some applications may not require complete elimination of anisotropy (i.e., in applications that can tolerate a limited amount of skew), thereby facilitating the fabrication of spring structures including one or more layers that are non-saturated. For example, referring again to FIG. 4, in one alternative embodiment first layer 126 of spring structure 100 is formed at the compressive saturation point, and an isotropic tensile second layer 127 is formed below the tensile saturation point. In yet another alternative embodiment, first layer 126 of spring structure 100 is formed below the compressive saturation point, and second layer 127 is formed at the tensile saturation point. In yet other alternative embodiments, a spring structure may include saturated layers 126 and 127 separated by a non-saturated layer 128, such as that shown in FIG. 5(A), or saturated layers 126 and 127 with a non-saturated layer 130 formed thereon.

Figure 6:
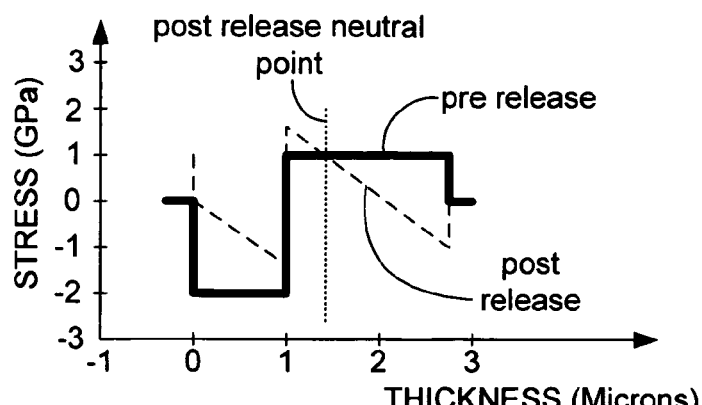
FIG. 6 is a graph depicting the stress profile of a balanced spring structure.

As mentioned above, anisotropy is minimized when a spring finger is entirely formed from isotropic material, such as in the embodiment shown in FIG. 4 where both first layer 126 and second layer 127 are at respective saturation points. The unfortunate side effect of fixing the endpoints of the stress profile at the saturation points is that the other variables remaining for tuning the spring radius are the spring layer thicknesses. This can lead to spring material film thicknesses that are not optimal. For example, FIG. 6 is a stress profile for a balanced spring structure formed from MoCr alloy (85/15 atomic-%) having a spring diameter of approximately 500 microns. As indicated in FIG. 6, the saturation point for such a spring material at room temperature is around −2 and +1 GPa. These saturation points require a spring material film having a thickness of approximately 2.8 microns (i.e., a compressive layer of approximately 0.923 microns and a tensile layer of approximately 1.847 microns or more) to produce balanced (i.e., substantially zero net) total internal stress, and to support the 3 GPa stress gradient at the interface between the compressive and tensile layers. This is many times thicker than many applications would require, and would therefore make such springs much more expensive to produce. In addition, because of the large peeling moment (0.92 GPa-μm) at the interface between layer 126 and release material portion 110 produced by this arrangement, delamination of spring finger 120 can become a problem. Note that, in FIG. 6, pre-release stress levels are shown as a solid thick line, and post-release stress levels are indicated with the thinner, dashed line.

Figure 7:
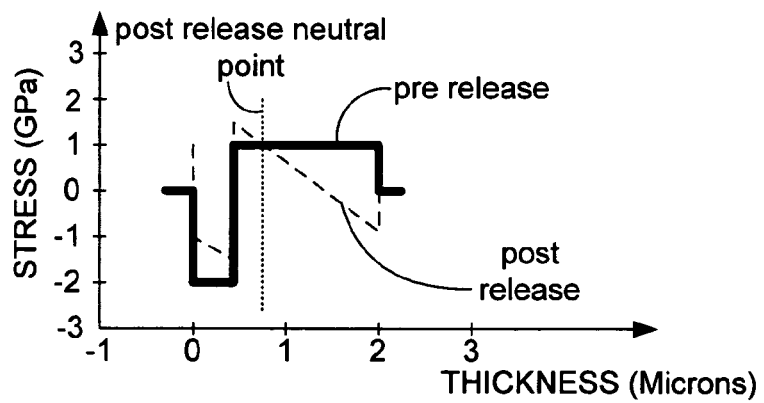
FIG. 7 is a graph depicting the stress profile of an unbalanced spring structure.

One alternative to producing thick balanced spring material films, such as those consistent with the stress profile shown in FIG. 6, is to produce unbalanced spring structures. Unbalanced springs have significantly non-zero net stress, and, as a result, must be more carefully designed to avoid failure. FIG. 7 is a stress profile for an unbalanced spring structure formed from MoCr alloy (85/15 atomic-%) and having a spring diameter of approximately 500 microns. In the spring structure represented by the stress profile of FIG. 7, the compressive layer has a thickness of approximately 0.4 microns, and the tensile layer has a thickness of approximately 1.6 microns. Notice that the unbalanced spring represented by FIG. 7 is about 70% as thick as the balanced spring in FIG. 6, even though both are formed from the same material, thereby reducing fabrication costs over balanced springs (discussed above). However, unlike balanced springs, the net stress in the unbalanced spring structure is substantially non-zero (e.g., 0.4 GPa or more, as in the example shown in FIG. 7). This substantial non-zero net stress must be considered in the design of such unbalanced springs in that it produces diameters that are more sensitive to errors in stress and film thickness. The peeling moment is also reduced from 0.92 GPa-μm (produced by the balanced spring shown in FIG. 6) to about 0.6 GPa-μm.

In addition to the balanced and unbalanced spring structures described above with reference to FIGS. 6, and 7, which have distinct tensile (negative stress) and compressive (positive stress) layers, it is also possible to form a spring using only tensile stress, or only compressive stress, provided that there is a stress differential. For example, a spring structure can be made using a saturated (first) compressive stress layer (i.e., internal stress of −2 GPa) having a thickness of 0.2 microns, and an anisotropic (second) compressive stress layer having an internal stress of −1 GPa and a thickness of 0.57 microns, which is formed on the isotropic layer. Note that in this example the anisotropic compressive stress layer is relatively tensile with respect to the isotropic compressive stress layer. The resulting spring structure would have a thickness of approximately 0.77 microns, a diameter of approximately 413 microns, a net stress after release of 1.29 GPa, and a net peeling moment of 1.02 GPa-μm.

Stress saturation of spring material films is achieved through various methods. In accordance with one disclosed method, which is described with reference to FIGS. 8(A) through 8(J), stress saturation is achieved by manipulating the fabrication parameters (i.e., temperature, pressure, and RF bias) under which the spring material film is grown to generate the saturated tensile or compressive stress. Additional methods are also described below.

Figure 8A:
FIGS. 8(A) through 8(J) are simplified cross-sectional side views showing process steps associated with the fabrication of a spring structure according to several embodiments of the present invention.

Referring to FIG. 8(A), the fabrication method begins with the formation of a conductive release material layer 210 over a glass (silicon) substrate 101. In one embodiment, release material layer 210 is formed from an electrically conductive material, and a portion 210A of release material layer 210 contacts a conductor 105 that is exposed on the upper surface of substrate 101. In one embodiment, release material layer 210 is Titanium (Ti) that is sputter deposited onto substrate 101 to a thickness of approximately 0.2 microns or greater. Titanium provides desirable characteristics as a conductive release material layer due to its plasticity (i.e., its resistance to cracking) and its strong adhesion. Other release materials having the beneficial plastic characteristics of titanium may also be used. In other embodiments, release material layer 210 includes another metal, such as Copper (Cu), Aluminum (Al), Nickel (Ni), Zirconium (Zr), or Cobalt (Co). Release material layer 210 may also be formed using heavily doped silicon (Si). Further, two or more release material layers can be sequentially deposited to form a multi-layer structure. In yet another possible embodiment, any of the above-mentioned release materials can be sandwiched between two non-release material layers (i.e., materials that are not removed during the spring finger release process, described below). Alternatively, when it is not necessary to provide electrical conduction between the subsequently deposited spring material layer and a contact pad (such as conductor 105), release material layer 210 can be a non-conducting material such as Silicon Nitride (SiN).

Figure 8B:
Figure 8C:
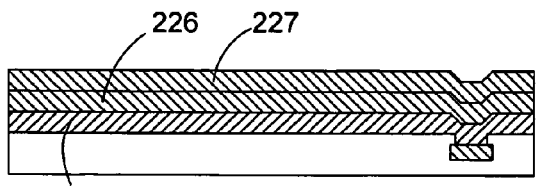
Figure 8D:
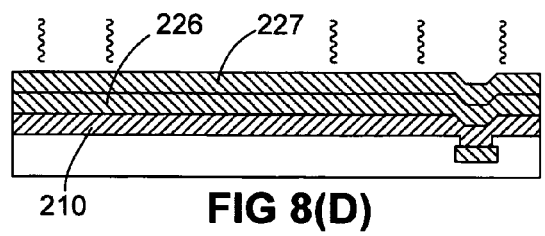

FIGS. 8(B) through 8(D) show the formation and optional annealing of a spring material film in accordance with various embodiments of the present invention, discussed below. FIG. 8(B) shows a lower (first) stress-engineered spring material layer 226 formed on release material layer 210 using processing techniques selected to produce a compressive internal stress in lower layer 226 that is at or near the compressive saturation point. In one embodiment, spring material layer 226 includes MoCr (85/15-atomic %) sputter deposited to a thickness of 0.1 to 2.5 microns using processing parameters suitable for producing saturated compressive stress. For example, compressive layer 226 may be generated using sputter deposition performed in an Argon atmosphere maintained at a pressure of 0.1 mT or greater, and an applied radio frequency (RF) bias of 0.2 Watt/cm² or greater, the deposition being performed at nominally room temperature (i.e., some heating of the substrate will occur from the deposition process). In general, this applied bias will result in additional bombardment of the growing film, and in turn will drive the material toward the compressive saturation point. Higher bias power levels can compensate for the effects of gas scattering, and thereby permit operation at higher pressures. FIG. 8(C) shows an upper (second) spring material layer 227 formed on lower layer 226 using processing techniques selected to produce a tensile internal stress in upper layer 227. In another embodiment, the tensile internal stress in upper layer 227 is at or near the tensile saturated stress point. For example, MoCr (85/15) spring material is sputter deposited to a thickness of 0.1 to 2.5 microns on lower layer 226, depending on the design radius and on whether a balanced or unbalanced spring is being formed. To achieve the desired tensile stress saturation, substrate 101 is maintained at room temperature, and sputter deposition is performed in an Argon atmosphere maintained at a pressure of 4 mT or greater, and an applied RF bias in the range of 0 to 0.25 Watts/cm². If acceptable stress saturation is achieved in one or both of lower layer 226 and upper layer 227 using the processing parameters described above, annealing (shown in FIG. 8(D)), may be omitted.

Figure 9:
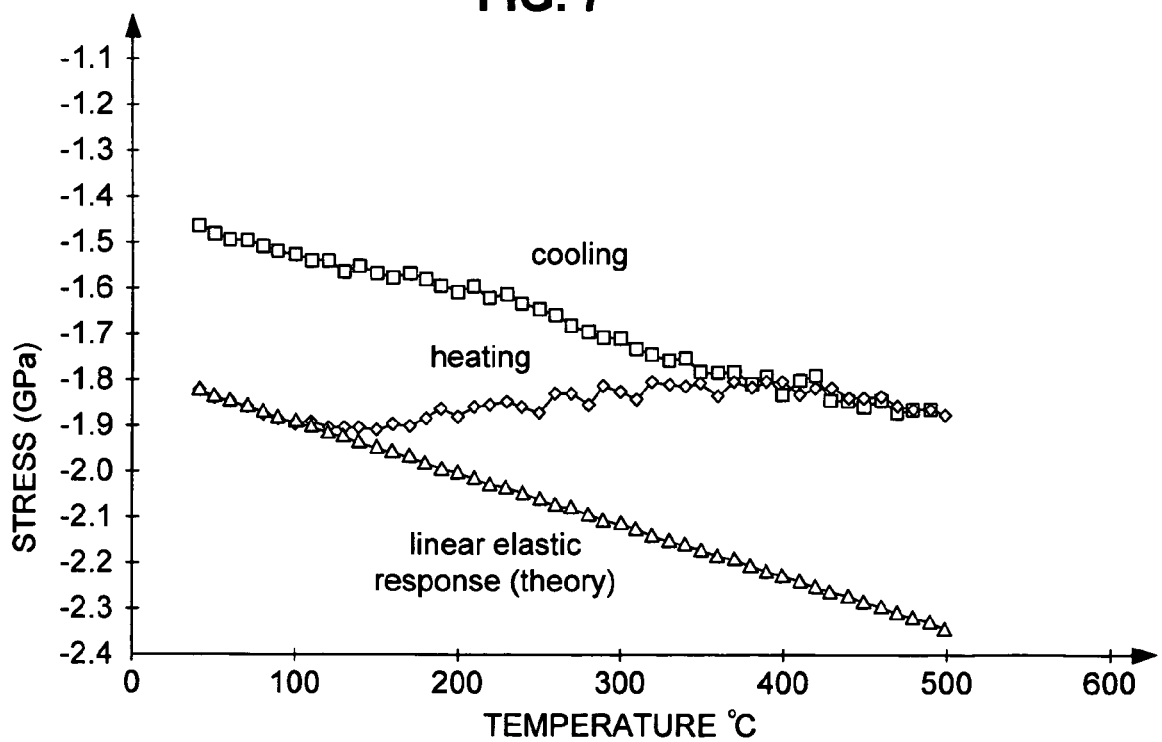
FIG. 9 is a graph depicting the effects of annealing on the internal stress of a MoCr alloy.

In accordance with another embodiment of the present invention, the deposition process of FIGS. 8(B) and 8(C) is carried out at an elevated temperature that is selected to tune the saturation point of the spring material (e.g., MoCr 85/15-atomic % alloy). MoCr alloy is a very refractory spring material in that it melts above 2000° C. However, the present inventors learned through experimentation that some of the stress in the MoCr alloy may be annealed out ex-situ (e.g., during the anneal process shown in FIG. 8(D)) at fairly low temperatures (i.e., less than 350° C.). This experimental data is shown in FIG. 9, which shows the effect of temperature variation on the internal stress of MoCr (85/15) alloy. In FIG. 9, measured data is indicated as diamonds (heating) and squares (cooling), and theoretical data (triangles). Theoretical behavior based on linear elastic response suggests that formation of saturated spring material film at a high temperature (e.g., 400° C.) would result in a net tensile shift of the stress upon cooling. The actual data suggests that annealing the spring material film and/or forming the spring material film above approximately 100° C. causes relaxation that results in a tensile shift of the internal stress upon subsequent cooling. This may be particularly relevant for layers of the spring material film subjected to compressive stress, which can easily be bombarded in order to reach very high stress levels, but is difficult to make uniform. In other words, because compressive growth is performed at lower pressure, there is less gas scattering present to homogenize the deposition angle to produce uniform stress. Accordingly, when spring material films (e.g., MoCr alloy) are maintained at an intermediate temperature in-situ during growth (i.e., during one or both of the processes shown in FIGS. 8(B) and 8(C)), the saturation point of the spring material is reduced to something that is below its room temperature yield. Therefore, growth at elevated temperatures (i.e., above 100° C., more preferably 150° C. to 400° C., and most preferably at 350° C.) is believed to achieve isotropic stress characteristics at stress magnitudes that are lower than that achieved during cold deposition. Tuning down the saturation point may have the additional advantage of making the material stronger since it will ensure that at room temperature, the stresses in the material will be far removed from the yield point.

The data shown in FIG. 9 also indicates that annealing above 100° C. (e.g., during the process indicated in FIG. 8(D)) may be employed to cause stress relaxation in a spring material film grown at room temperature. In particular, annealing in the range of 100 to approximately 400° C. may produce relaxation, resulting in substantially less internal stress upon cooling. Annealing significantly above approximately 350 to 400° C. is not believed to further alter the stress appreciably.

Referring again to FIG. 9, note that as the film is cooled, the MoCr becomes more tensile due to the relative thermal expansion rate with respect to silicon. According to another embodiment of the present invention, this expansivity difference is exploited to reduce the stress level of the compressive layer. In one example, compressive layer 226 (FIG. 8(B)) is deposited at elevated temperature (e.g., greater than 200° C., preferably 350° C.), and then tensile layer 227 (FIG. 8(C)) is deposited at a lower deposition temperature (e.g., less than 200° C., preferably 50° C.). The tensile stress of layer 227 is optionally kept uniform by non-saturating methods, if needed, such as using high-pressure gas scattering (discussed below). During the cooling to the lower temperature the compressive stress would be reduced by an amount given by the equation $$\Delta\sigma = Y'(\alpha_{MoCr} - \alpha_{Si})(T_2 - T_1)$$

where $\alpha_{MoC}$ and $\alpha_{Si}$ are the expansivities of the MoCr film and silicon substrate, respectively, and $T_1$ and $T_2$ are the two temperatures. Y' is the biaxial elastic modulus of MoCr.

Figure 8E:
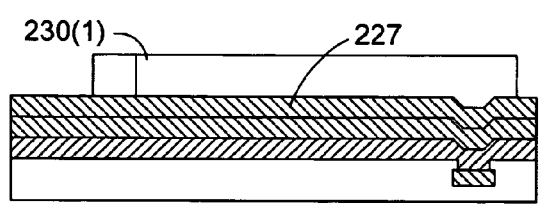
Figure 8F:
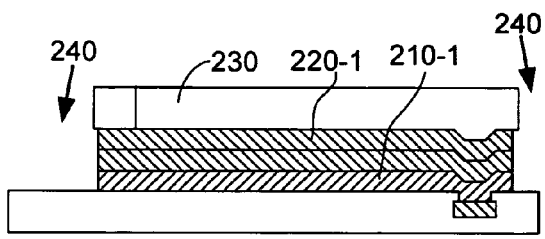

Referring to FIG. 8(E), after the spring material film is produced using one or more of the methods described above, elongated spring material (first) masks 230 (e.g., photoresist) are then patterned over a selected portion of the exposed upper layer 227. Next, as indicated in FIG. 8(F), exposed portions of stress-engineered material film 220 surrounding the spring material mask 230 are etched using one or more etchants 240 to form a spring material island 220-1. Note that this etching process is performed such that limited etching is performed in portions 210B of release layer 210 that surround spring material island 220-1 such that at least a partial thickness of release layer portion 210B remains on substrate 101 after this etching step. In one embodiment, the etching step may be performed using, for example, a wet etching process to remove exposed portions of stress-engineered material film 220. This embodiment was successfully performed using cerric ammonium nitrate solution to remove a MoCr spring metal layer. Many additional etching process variations and material selections may be used in place of the examples given, which are not intended to be limiting.

Figure 8G:
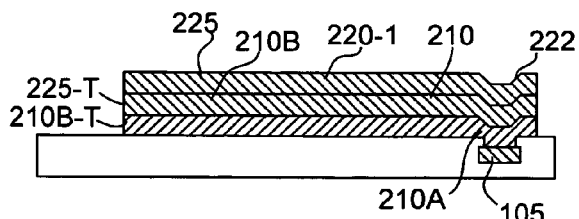

FIG. 8(G) shows spring material island 220-1 and release material 210 after spring material mask 230 (FIG. 8(F)) is removed. Note again that electrical connection between conductor 105 and spring material island 220-1 is provided through portion 210A of release material layer 210.

Figure 8H:
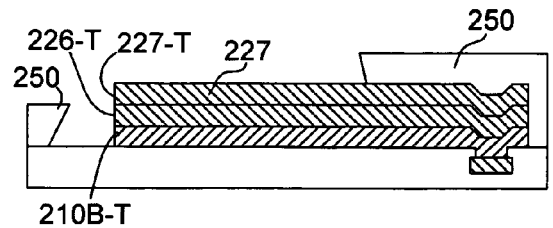

Referring to FIG. 8(H), release (second) mask 250 (e.g., photoresist) is then formed on a first portion 220-1A of spring material island 220-1. Release mask 250 defines a release window RW, which exposes a second portion 220-1B of spring material island 220-1 and surrounding portions 210B of release material layer 210.

Figure 8I:
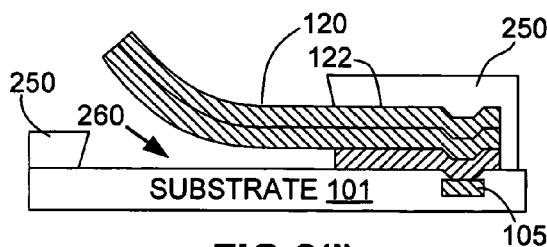

Referring to FIG. 8(I), a release etchant 260 (e.g., a buffered oxide etch) is then use to selectively remove a portion of the release material layer from beneath the exposed portion of the spring material island to form spring finger 120 (discussed above with reference to FIGS. 1–3). Specifically, removal of the exposed release material causes free portion 125 to bend away from substrate 101 due to the internal stress variations established during the formation of the spring material film (discussed above). Note that anchor portion 122 remains secured to substrate 101 by release material portion 110, which is protected by release mask 250. Note also that when release material portion 110 is formed from a conductive release material, the resulting spring structure is electrically coupled to conductor 105.

Figure 8J:
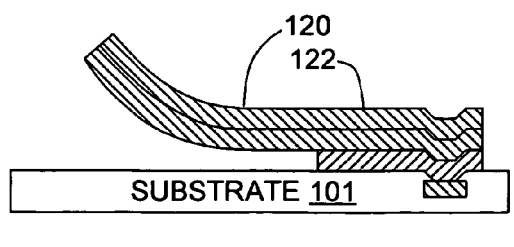

Finally, FIG. 8(J) shows spring structure 100 during the removal of release mask 250. Referring briefly to FIG. 8(I), note that the negative-sloped sidewall of release mask 250 produces an exposed edge 250-E under an optional post-release coating (e.g., coating 130 in FIG. 5(A)). This exposed edge allows access of a solvent that dissolves release mask using known techniques. For example, when the release mask is image-reversed photoresist, acetone can be used as the solvent. As the release mask is dissolved, residual coating portions formed thereon are lifted off. If necessary, agitation may be used to accelerate the lift-off process.

The example described above is particularly directed to a MoCr (85-15 atomic %) alloy spring material. In accordance with yet another aspect of the present invention, the saturation point of the spring material may also tuned by adjusting the spring material composition to beneficially modify its yield point. Some metals are softer and have lower yield points than Mo and Cr, and therefore the stress of a composition including these softer metals is typically saturated at lower stress values. Preferably, materials with a ratio of elastic modulus to yield point that produces spring radii in the range desired are selected. For example, NiZr alloys have saturated stress at lower stress values than those of MoCr alloys. Other possibilities include the use of other Ni alloys, NiCu alloys (e.g., Monel®), BeCu, Phosphor Bronze, or alloys of refractory materials such as Mo, Cr, Ta, W, Nb. In yet another example, the yield point of a MoCr alloy may be tuned (reduced) by including one or more "soft" metals (e.g., In, Ag, Au, Cu).

Even with significant relaxation and/or saturation point tuning, spring material films utilizing compressive and tensile saturated stress layers produce significant stress moments, which can result in delamination of the spring structure along spring release layer or release layer/substrate interface. It is therefore desirable to deposit spring material with isotropic stress at levels continuously (gradually) ranging within the most compressive to the most tensile values sustainable in the spring material. Continuous variation of the stress is desirable because it reduces the amount of residual stored elastic energy in the spring after release. In FIG. 6, for example, the residual stress (dashed line) of a saturated stress spring is shown to be substantial, whereas had the initial stress consisted of a linear rather than a stepwise profile, the residual stress (in the bending direction) would be approximately zero. Stepwise profiles with more than two levels approximate a linear profile better, and have less residual stress. Such profiles also have less abrupt stress transitions. Each transition produces internal shear within the spring. The present inventors have observed that under some conditions, spring breakage is correlated with the abruptness of the stress level transitions. One solution to the abrupt stress level transitions associated with saturated stress springs, similar to that shown in FIG. 5(B), is to include an additional metal layer (e.g. gold) that is usually sputtered, not plated, on the top and/or bottom of the spring material to suppress breakage. However, including this solution increases production costs. It is therefore desirable to have a process for creating isotropic stress over a continuous range of stress (i.e., gradually changing from compressive to tensile).

Figure 10:
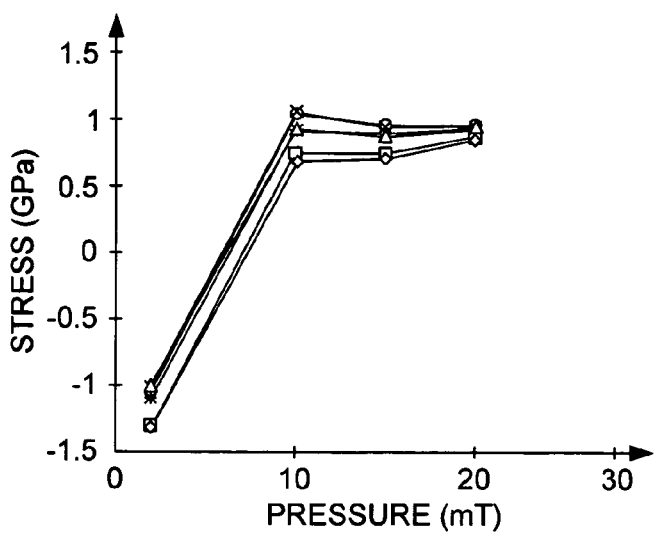
FIG. 10 is a graph depicting the effects of pressure on internal stress of a MoCr alloy measured at various points in a deposition chamber.

In accordance with another embodiment of the present invention, anisotropy is reduced in spring material films through variation in pressure during the deposition process. In particular, by increasing the pressure inside the deposition chamber, the arriving species are scattered by the sputtering gas (typically Ar gas). Experiments using a Wilder MV40 modular vertical magnetron deposition tool (a vertical cathode sputter system) showed the anisotropy of a MoCr alloy (85/15) film to fall almost to zero at around 20 mT. FIG. 10 shows stress vs. pressure calibration data for the Wilder tool with a 1-inch substrate to target spacing. This figure shows that there is a convergence of the stresses measured at three separate pallet positions at the highest pressure (20 mT). In contrast, the stress differences are greatest at 10 mT. Suitable anisotropy reduction is achieved above approximately 15 mT. At pressures that are too high (e.g., greater than 20 mT), films grown at low temperature and/or zero bias may tend to become mechanically weak, and as a result, the tensile stress decreases. The cause of mechanical weakness is likely to be large voids in the material. The pressure at which this weakness occurs is very dependent on the sputter configuration and other parameters, such as distance and power. Suitable films are formed when the pressure-distance product is in the range of 10 to 350 mT-cm. An applied RF bias (e.g., 0.05 Watts/cm$^2$ or more) tends to increase the bombardment of the substrate, thereby increasing the density. An elevated substrate temperature (e.g., 150° C. or more) will increase the surface diffusion of material incorporated into the growing film, also tending to increase the density. Heating and/or biasing the substrate will help avoid mechanical weakness. Properly balancing pressure, temperature and bias is believed to produce tensile stress homogeneity through gas scattering while avoiding the mechanical degradation of the film due to porosity. Homogenizing the stress via gas scattering has two distinct advantages over material saturation in that the effect can potentially operate at any stress setpoint required for the spring design, and the stress can potentially be varied continuously.

Although FIG. 10 might make it appear that pressure homogenization can only work for creating uniform tensile stress, with sufficient applied bias to the substrate, the inventors believe that the spring material may be bombarded into a compressive state at high pressure as well. In accordance with the present embodiment, therefore, a spring structure including both compressive (lower) and tensile (upper) layers and having a continuously varying internal stress profile therebetween is produced by depositing at a high pressure while gradually decreasing the applied RF bias during the deposition run in order to make the stress trend from compressive to tensile.

In accordance with another embodiment of the present invention, an isotropic spring material film is formed using directed deposition techniques. That is, the present inventors have determined that another way to make the internal stress of the spring material film uniform in is to utilize a directional deposition process in which every atom or ion that hits the growing film is moving, at least on average, normal to the substrate.

Figure 11A:
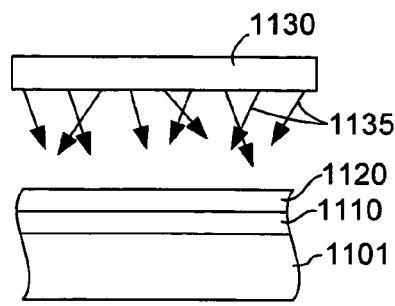
FIGS. 11(A) and 11(B) are simplified side views depicting the deposition of spring material using non-directional and directional deposition techniques, respectively.

FIG. 11(A) is a simplified side view showing a typical sputter deposition process used to form a spring material film 1120 on a wafer (substrate) 1101, upon which is formed a release material layer 1110. According to known methods, a voltage is applied to a target 1130, which is made of spring material (e.g., MoCr), such that particulate material 1135 is separated (sputtered) from target 1130 and travels toward wafer 1101. As indicated in FIG. 11(A), the typical sputter deposition process causes deposition material 1135 to assume a broad angular distribution that forms spring material film 1120. Accordingly, separate points on wafer 1101 are subjected to differing angular distributions of material, and therefore the principal axes of stress formed in spring material film 1120 are aligned in various directions throughout wafer 1101. In a planetary system that mounts wafers on a double-rotation mechanism for example, the principal axes of the stress tend to align with the radial and tangential directions of the wafer. One would expect a similar effect in most cluster tools that utilize rotating magnets behind the sputter source.

Figure 11B:
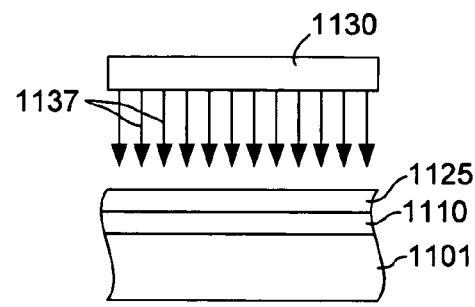

In accordance with the method depicted in FIG. 11(B), one or more directional deposition methods are utilized to influence the path taken by material 1135 leaving target 1130 such that a majority of the atoms or ions that hit the growing film 1120 are moving normal to substrate 1101. The present inventors have experimentally determined that the use of directional deposition greatly reduces stress anisotropy in spring material film 1120 because material 1135 strikes all points on wafer 1101 in only one direction, thereby eliminating the differing angular distributions associated with conventional deposition methods. Note that release material layer 1110 is formed in the manner described above with reference to FIG. 8(A), and further processing of the isotropic spring material film 1120 is performed as described above with reference to FIGS. 8(E) through 8(J).

According to the present invention, various directional deposition methods that have been previously used to produce, for example, via structures in conventional integrated circuit devices are utilized to produce isotropic spring material films. Such methods include the use of biased ionized deposition, long throw sputtering, and collimated sputtering, each of which is described in more detail below. These directional deposition methods have been used to fill high aspect ratio vias, which is important for IC (integrated circuit) manufacturing in order to reduce capacitance, lower resistance and pack more circuits onto a chip. However, the present inventors do not believe these methods have been previously considered for producing spring material films, in part, because the problems addressed in spring material film formation are quite different from those of via formation. That is, in contrast to via formation in which atoms are directed into a hole, directed deposition is utilized to minimize internal stress anisotropy during the formation of spring material film. Directed deposition has two distinct advantages over material saturation in that the effect can potentially operate at any stress setpoint required for the spring design, and the stress can potentially be varied continuously to produce the compressive-to-tensile stress profile associated with the spring material films of the present invention.

In biased ion deposition, the directionality of atoms/ions is influenced using an applied RF bias. Sputter deposition is usually performed by generating a plasma in a deposition chamber containing an Argon gas atmosphere. The Argon gas and the sputtered spring material (e.g., metals) in a conventional plasma consist primarily of neutrals and positive ions. Most of the metals in a typical plasma are neutrals, and hence they will not be influenced by the applied bias. Much of the Argon bombardment that produces compressive stress is from reflected Argon neutrals. Utilizing an RF bias of 0.25 Watts/cm$^2$ or more to orient the direction of the bombardment and the depositing flux therefore is required for producing more ions. A lot of effort has gone into making more ions in the sputter plasma in the context of via formation and the lift-off of sputtered films. For via filling, in addition to an applied bias (typically a negative self-bias resulting from an RF bias to the substrate) effort must be made to ionize the majority (i.e., greater than 50%) of the metal species in the plasma. Generating more ions can be achieved a variety of ways known in the art.

Figure 12:
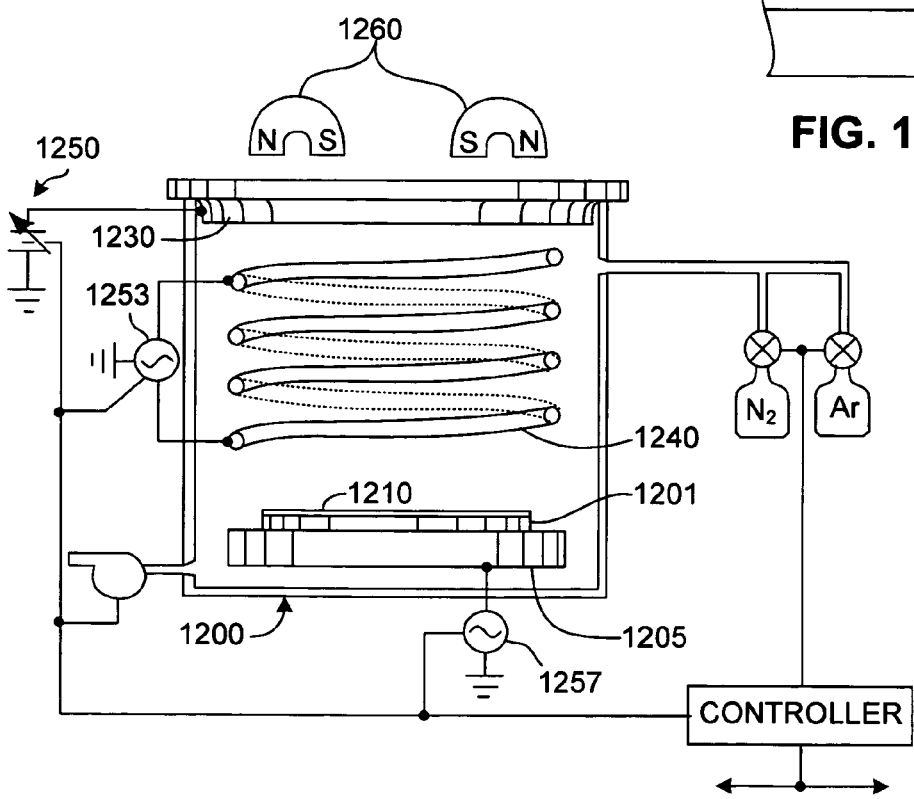
FIG. 12 is a simplified side view showing a deposition chamber utilized to produce spring structures according to another embodiment of the present invention.

FIG. 12 is a schematic side view showing a system for generating a highly ionized plasma in a deposition (vacuum) chamber 1200 to produce a spring material film in accordance with an embodiment of the present invention. A substrate (wafer) 1201 is placed on a pedestal electrode 1205 at a bottom of deposition chamber 1200. Note that substrate 1201 already has formed thereon a release material layer 1210, which is formed in the manner described above. Located at an upper end of chamber 1200 is a target 1230, and a vertically oriented coil 1240 is wrapped around the space located between target 1230 and substrate 1201. A DC power supply 1250 negatively biases target 1230. An RF power source 1253 supplies electrical power in the megahertz range to inductive coil 1240. The DC voltage applied between target 1230 and substrate 1201 causes the processing gas supplied to the chamber to discharge and form a plasma. The RF coil power inductively coupled into chamber 1200 by coil 1240 increases the density of the plasma. Magnets 1260 disposed above target 1240 significantly increase the density of the plasma adjacent to target 1230 in order to increase the sputtering efficiency. Another RF power source 1257 applies electrical power in the frequency range of 100 kHz to a few megahertz to pedestal 1205 in order to bias it with respect to the plasma. This technique is described in S. M. Rossnagel and J. Hopwood, "Metal Ion Deposition from Ionized Magnetron Sputtering Discharge", J. Vac Sci Tech, B 12(1), pp 449–453; see also U.S. Pat. No. 6,238,533 to Satitunwaycha et al. The resulting deposition of sputtered MoCr material from target 1230 is acted upon by the RF bias such that a majority of the atoms or ions that hit the film growing on release material 1210 are moving normal to substrate 1201.

Pulsed sputtering is another method for producing more ions to form isotropic spring material films in accordance with the present invention. High current pulsed sputtering is a way to make lots of ions. There have been some recent developments in this area lead by Ulf Helmersson in Linköping Sweden. These developments use pulses of hundreds of amps, and megawatts of power, that last for 10's or 100's of microseconds (see Gudmundsson, J. T.; Alami, J.; Helmersson, U., "Evolution of the Electron Energy Distribution and Plasma Parameters in a Pulsed Magnetron Discharge", Applied Physics Letters, 78(22), pp 3427–9 (2001); see also Helmersson, U.; Khan, Z. S.; Alami, J., "Ionized-PVD by Pulsed Sputtering of Ta for Metallization of High-Aspect-Ratio Structures in VLSI", Proceedings of International Conference on Advanced Semiconductor Devices and Microsystems (ASDAM), pp 191–5 (2000)). This results in a much denser plasma than what is achieved under continuous operating conditions. A big advantage of this technique is that it does not require placing an RF coil in the process chamber. The degree of ionization is close to 100%, which allows the use of applied electric or magnetic fields to control the direction of the spring material striking the substrate.

According to another specific embodiment, spring materials are grown using "long throw" techniques in which a wafer (substrate) is placed one diameter of the wafer or more away from the target (i.e., when the wafer is stationary). The farther away the sputter source, the more collimated the deposited material becomes. This approach to making sputter systems has also been used for filling vias. Typically, the distance between the target and the substrate in a cluster tool in about 2 inches (less than one wafer diameter). If however the distance is increased to one wafer diameter or more, the range of angles with which the flux arrives is reduced. By cutting out shallowest angles of the deposition, the stress anisotropy is believed to be reduced. Note that, if the wafer (substrate) is moving, or multiple substrates are used, to achieve the effects of long throw, the distance must be on the order of the size of the holder containing the substrates, and its range of motion, if any, relative to the target.

The present inventors have looked into various deposition geometries and wafer handling configurations. In single chamber systems with multiple targets, cross contamination has produced some unexpected results. These include metal contamination altering the stress level in the film for a given process condition, electrochemical effects during etching resulting from interface intermixing, and the presence of residues after etching due to insoluble contaminants. All of the effects occur because single chamber systems have sputter cathodes for materials that form the release, spring and cladding layers of the spring. When one cathode is sputtering and the other is exposed, the exposed cathode accumulates contamination build-up on its target.

In accordance with another embodiment of the present invention, spring structures are produced using an integrated multi-chamber tool ("cluster tool") that is configured such that separate chambers are utilized for each of the sputter targets and the etching function, thereby maintaining the integrity of the sputter targets throughout the production process.

FIG. 13 is a simplified top plan view showing a cluster tool 1300 configured in accordance with an embodiment of the present invention. One such cluster tool is the Endura RTM 5500 platform, which is functionally described by Tepman et al. in U.S. Pat. No. 5,186,718.

Wafers 1301 are loaded into the system by two independently operated loadlock chambers 1305 configured to transfer wafers into and out of the system from wafer cassettes loaded into the respective loadlock chambers. The pressure of a first wafer transfer chamber 1304 to which the loadlocks can be selectively connected via unillustrated slit valves can be regulated. After pump down of the first transfer chamber 1304 and of the selected loadlock chamber 1303, a first robot 1306 located in the first transfer chamber 1304 transfers the wafer from the cassette to one of two wafer orienters 1308 and then to a degassing orienting chamber 1312. First robot 1306 then passes the wafer into an intermediately placed plasma preclean chamber 1314, from which a second robot 1316 transfers it to a second transfer chamber 1318, which is kept at a low pressure. Second robot 1316 selectively transfers wafers to and from reaction chambers arranged around its periphery. When materials within the substrate have a tendency to retain moisture, such as polyimide, it is common to include a dehydration chamber on the sputter tool to bake away the retained moisture prior to processing. This step usually precedes the preclean step.

In accordance with the present embodiment, a first deposition chamber 1320 is utilized to form a release material layer on each substrate according to the methods described above, one or more second deposition chambers 1322 and 1324 are used to form spring material film on the release material layer. In particular, first deposition chamber is configured with a suitable target formed from a selected release material (e.g., Titanium), and second deposition chambers 1322 and/or 1324 are configured with suitable targets formed from a selected spring material (e.g., MoCr alloy). Accordingly, as indicated in the flow diagram shown in FIG. 14, each wafer 1301 is moved into first chamber 1320 (block 1410) for release layer formation (block 1420), and then moved to second chamber 1322/1324 (block 1430) for spring material film formation (block 1440) according to one or more of the methods described above. Note that, when two different process parameters are utilized to produce the compressive layer and tensile layer, both chambers 1322 and 1324 are configured with similar spring material targets and otherwise optimized for the respective different processes. For example, if the compressive layer and tensile layer are formed at different temperatures, then chambers 1322 and 1324 are maintained at these different temperatures to minimize the time required to change between these two temperatures. After formation of the spring material film, substrates 1301 are removed from the cluster tool, and transferred to a suitable third chamber (block 1450 in FIG. 14) for subsequent etching and spring finger formation (block 1460) according to the process described above. By performing these deposition processes in separate chambers, and by performing etching/release in yet another chamber (or more), cross contamination of the respective targets is avoided, thereby avoiding the problems associated with single chamber production.

In yet another embodiment, a multi-chamber sputter tool with chambers arranged in a vertical inline geometry and configured as described above can be used in place of cluster tool 1300.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for forming a spring structure, the method comprising:
   forming a release material layer over a substrate;
   forming a spring material island on the release material layer, the spring material island including a stress-engineered film having a stress variation in a direction normal to the substrate and including at least one layer having an isotropic internal stress; and etching a portion of the release material layer disposed under a portion of the spring material island, whereby the portion of the spring metal island bends away from the substrate due to the internal stress gradient, thereby forming a spring finger having an anchor portion attached to the substrate and a curved free portion disposed away from the substrate.

2. The method according to claim 1, wherein the spring material island comprises a spring material having a compressive stress saturation point and a tensile stress saturation point, wherein forming the spring material island comprises forming a first layer having a compressive internal stress on the release material layer, and forming a second layer having a tensile internal stress over the first layer.

3. The method according to claim 2, wherein forming the first layer further comprises depositing the first layer using processing parameters selected such that the first layer is produced at the compressive saturation stress point.

4. The method according to claim 3, wherein forming the first layer comprises sputter depositing the first layer in an Argon atmosphere maintained at a pressure of 0.1 mT or greater, and an applied RF bias of 0.2 Watt/cm$^2$ or greater, wherein the deposition is performed at room temperature.

5. The method according to claim 3, wherein forming the first layer comprises sputter depositing the first layer while maintaining the first layer at a temperature greater than 100° C.

6. The method according to claim 5, wherein forming the first layer comprises sputter depositing the first layer while maintaining the first layer in the range of 150° C. to 400° C.

7. The method according to claim 5, wherein forming the first layer comprises sputter depositing the first layer while maintaining the first layer at approximately 350° C.

8. The method according to claim 2, wherein forming the second layer further comprises depositing the second layer using processing parameters selected such that the second layer is produced at the tensile saturation stress point.

9. The method according to claim 8, wherein forming the second layer comprises sputter depositing the second layer in an Argon atmosphere maintained at a pressure of 4 mT or greater, and an applied RF bias in the range of 0 to 0.25 Watts/cm$^2$, wherein the deposition is performed at room temperature.

10. The method according to claim 8, wherein forming the second layer comprises sputter depositing the second layer while maintaining the second layer at a temperature greater than 100° C.

11. The method according to claim 10, wherein forming the second layer comprises sputter depositing the second layer while maintaining the second layer in the range of 150° C. to 400° C.

12. The method according to claim 10, wherein forming the second layer comprises sputter depositing the second layer while maintaining the second layer at approximately 350° C.

13. The method according to claim 2, wherein forming the first and second layers further comprises depositing the first layer using first processing parameters selected such that the first layer is produced at the compressive saturation stress point, and forming the second layer comprises depositing the second layer using second processing parameters selected such that the second layer is produced at the tensile saturation stress point.

14. The method according to claim 13, wherein forming the first and second layers comprises:

sputter depositing the first layer in an Argon atmosphere maintained at a pressure of 0.1 mT or greater, and an applied RF bias of 0.2 Watt/cm$^2$ or greater, sputter depositing the second layer on the first layer in an Argon atmosphere maintained at a pressure of 4 mT or greater, and an applied RF bias in the range of 0 to 0.25 Watts/cm$^2$, wherein both depositions are performed at nominally room temperature.

15. The method according to claim 13, wherein forming the first and second layers comprises sputter depositing the first and second layers while maintaining the first and second layers at a temperature greater than 100° C.

16. The method according to claim 15, wherein forming the first and second layers comprises sputter depositing the first and second layers while maintaining the first and second layers in the range of 150° C. to 400° C.

17. The method according to claim 15, wherein forming the first and second layers comprises sputter depositing the first and second layers while maintaining the first and second layers at approximately 350° C.

18. The method according to claim 2, wherein the first layer is deposited at a temperature greater than 100° C., and the second layer is deposited at a temperature less than 400° C.

19. The method according to claim 3, further comprising annealing the stress-engineered film at a temperature greater than 100° C. before etching the release layer.

20. The method according to claim 19, wherein annealing the stress-engineered film comprises maintaining at the stress-engineered film at a temperature in the range of 150° C. to 400° C.

21. The method according to claim 19, wherein annealing the stress-engineered film comprises maintaining at the spring material film at a temperature in the range of 325° C. to 375° C.

22. A method for fabricating a spring structure, the method comprising:

forming a release material layer over a substrate, forming a first layer of a spring material over the release material layer such that the first layer has a compressive internal stress;

forming a second layer of the spring material over the first layer such that the second layer has a tensile internal stress; and selectively removing a first portion of the release material layer from beneath a free portion of first and second layers using a release mask that covers an anchor portion of the first and second layers, where upon removing the first portion of the release material layer, the internal stresses of the first and second layers cause the free portion of the first and second layers to bend relative to the substrate, thereby forming a spring finger, wherein at least one of the compressive internal stress of the first layer and the tensile internal stress of the second layer is isotropic.

23. A method for forming a spring structure, the method comprising:

forming a release material layer over a substrate;

depositing a stress-engineered film on the release material layer at an argon pressure greater than 4 mT while varying at least one of substrate temperature and applied RF bias such the stress-engineered film has an internal stress variation in the growth direction; and etching a portion of the release material layer disposed under a portion of the stress-engineered film, whereby the portion of the stress-engineered film bends away from the substrate due to the internal stress gradient, thereby forming a spring finger having an anchor portion attached to the substrate and a curved free portion disposed away from the substrate.

24. The method according to claim 23, wherein depositing the stress-engineered film comprises maintaining a pressure-distance product in the range of 10 to 350 mT-cm.

25. The method according to claim 23, wherein depositing the stress-engineered film comprises positioning the substrate below a sputter target at a distance of one inch or greater.

26. The method according to claim 23, wherein sputter depositing the stress-engineered film further comprises heating the substrate to a temperature of 100° C. or higher.

27. The method according to claim 23, wherein sputter depositing the stress-engineered film further comprises decreasing an applied RF bias such that the internal stress of the stress-engineered film changes from compressive to tensile in the growth direction.

28. A method for forming a spring structure, the method comprising:
    forming a release material layer over a substrate;
    depositing spring material atoms from a target toward the substrate to grow a stress-engineered film on the release material layer, wherein the deposition is controlled such that a majority of the spring material atoms that hit the growing spring material film are moving normal to the substrate; and
    etching a portion of the release material layer disposed under a portion of the stress-engineered film, whereby the portion of the stress-engineered film bends away from the substrate due to the internal stress gradient, thereby forming a spring finger having an anchor portion attached to the substrate and a curved free portion disposed away from the substrate.

29. The method according to claim 28, wherein depositing the stress-engineered film comprises applying an RF bias of 0.25 Watts/cm$^2$ or more to the substrate.

30. The method according to claim 28, wherein depositing the stress-engineered film comprises generating high current pulses in the deposited spring material atoms using a power of 1 KW/cm$^2$ or greater, wherein each pulse lasts between 10 and 200 microseconds.

31. The method according to claim 28,
    wherein the substrate defines a wafer diameter, and
    wherein depositing the stress-engineered film comprises positioning the substrate one wafer diameter or more below the target.

32. The method according to claim 28, wherein depositing the spring material atoms comprises generating a plasma in which at least 50% of the spring material atoms are ionized.

* * * * *